United States Patent
Inoue et al.

(10) Patent No.: US 8,020,286 B2
(45) Date of Patent: Sep. 20, 2011

(54) ELECTRONIC COMPONENT MOUNTING SYSTEM AND ELECTRONIC COMPONENT MOUNTING METHOD

(75) Inventors: Masafumi Inoue, Saga (JP); Mitsuhaya Tsukamoto, Fukuoka (JP); Syoichi Nishi, Fukuoka (JP); Masahiro Kihara, Fukuoka (JP)

(73) Assignee: Panasonic Corporation, Osaka (JP)

( * ) Notice: Subject to any disclaimer, the term of this patent is extended or adjusted under 35 U.S.C. 154(b) by 88 days.

(21) Appl. No.: 12/090,274

(22) PCT Filed: Dec. 20, 2006

(86) PCT No.: PCT/JP2006/325985
§ 371 (c)(1),
(2), (4) Date: Jul. 13, 2009

(87) PCT Pub. No.: WO2007/072981
PCT Pub. Date: Jun. 28, 2007

(65) Prior Publication Data
US 2009/0293265 A1    Dec. 3, 2009

(30) Foreign Application Priority Data
Dec. 22, 2005    (JP) .............. P. 2005-369653

(51) Int. Cl.
H05K 3/36    (2006.01)
H05K 3/20    (2006.01)
(52) U.S. Cl. .......................... 29/832; 29/831
(58) Field of Classification Search .......... 29/832, 29/830, 831, 833, 834, 705, 720, 729, 739, 29/740, 741, 742
See application file for complete search history.

(56) References Cited

U.S. PATENT DOCUMENTS
5,086,556 A * 2/1992 Toi ................ 29/740
(Continued)

FOREIGN PATENT DOCUMENTS
JP    04-048698 A    2/1992
(Continued)

OTHER PUBLICATIONS
International Search Report Dated Apr. 25, 2007.

*Primary Examiner* — A. Dexter Tugbang
*Assistant Examiner* — David Angwin
(74) *Attorney, Agent, or Firm* — Pearne & Gordon LLP

(57) ABSTRACT

One objective of the present invention is to provide an electronic component mounting system and an electronic component mounting method that can prevent a mounting defect due to a positioning error in the direction of the thickness of a substrate, and that can deliver a specific mounting quality. According to an electronic component mounting system, which is constituted by coupling a plurality of apparatuses used for mounting electronic components, the height measurement device 22 of a printing inspection apparatus measures the heights at height measurement points, designated on the upper face of a substrate, and outputs the measurement results as substrate height data. Then, once the substrate has been delivered to an electronic component placing apparatus, the substrate height measurement apparatus again measures the height of the substrate at specific height measurement points to obtain substrate height correction data, and based on the initial substrate height data and the substrate height correction data, updates a control parameter for controlling the component placing operation performed by a loading head. In this manner, discrepancies in the positions of the heights of individual substrates can be accurately corrected, and mounting defects due to positioning errors in the direction of the heights of the substrates can be prevented.

5 Claims, 11 Drawing Sheets

U.S. PATENT DOCUMENTS

| | | | |
|---|---|---|---|
| 6,718,630 B2 * | 4/2004 | Hada et al. | 29/832 |
| 7,017,261 B2 * | 3/2006 | Okamoto et al. | 29/832 |
| 7,155,817 B2 * | 1/2007 | Hada et al. | 29/832 |
| 7,213,332 B2 * | 5/2007 | Inoue et al. | 29/840 |
| 7,284,318 B2 * | 10/2007 | Hartmann | 29/740 |
| 7,395,129 B2 * | 7/2008 | Yamazaki et al. | 700/104 |
| 7,726,013 B2 * | 6/2010 | Kimura | 29/832 |
| 7,752,748 B2 * | 7/2010 | Yamasaki et al. | 29/833 |
| 2002/0046462 A1 * | 4/2002 | Inoue et al. | 29/834 |
| 2002/0083570 A1 | 7/2002 | Inoue et al. | |
| 2002/0194729 A1 * | 12/2002 | Kuribayashi et al. | 29/834 |
| 2003/0101576 A1 * | 6/2003 | Hartmann | 29/740 |
| 2004/0085701 A1 * | 5/2004 | Inoue et al. | 361/135 |
| 2006/0048379 A1 * | 3/2006 | Onobori et al. | 29/832 |
| 2008/0127486 A1 * | 6/2008 | Hirata et al. | 29/832 |

FOREIGN PATENT DOCUMENTS

| | | |
|---|---|---|
| JP | 08-288691 A | 11/1996 |
| JP | 2002-134899 | 5/2002 |
| WO | 02/46713 | 6/2002 |
| WO | WO 02/46713 * | 6/2002 |
| WO | WO0246713 * | 6/2002 |

* cited by examiner

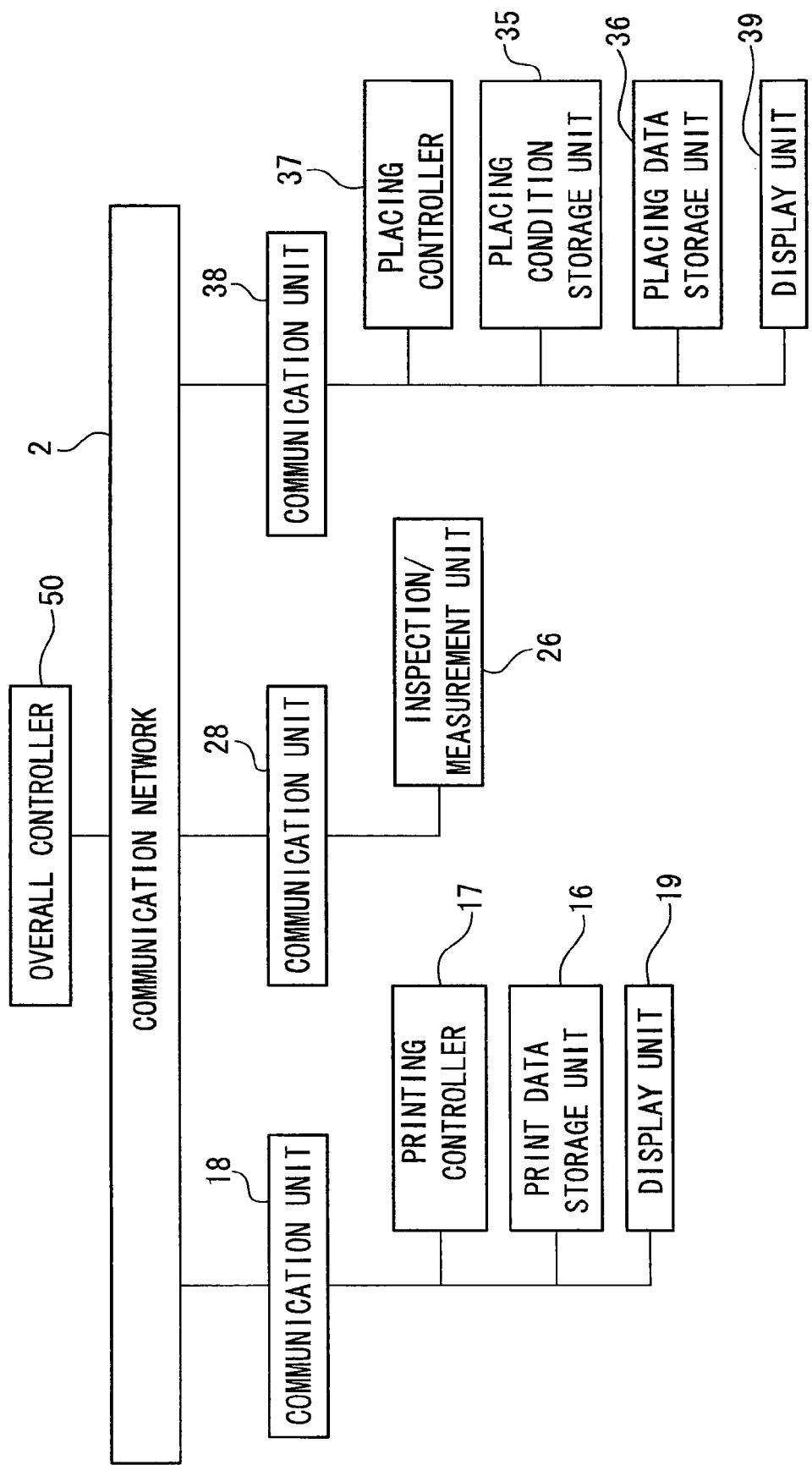

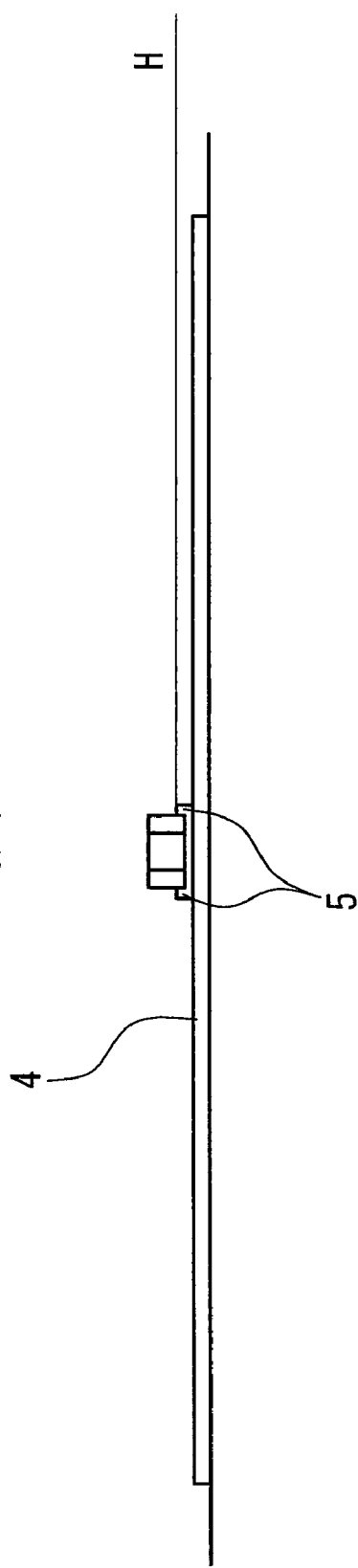
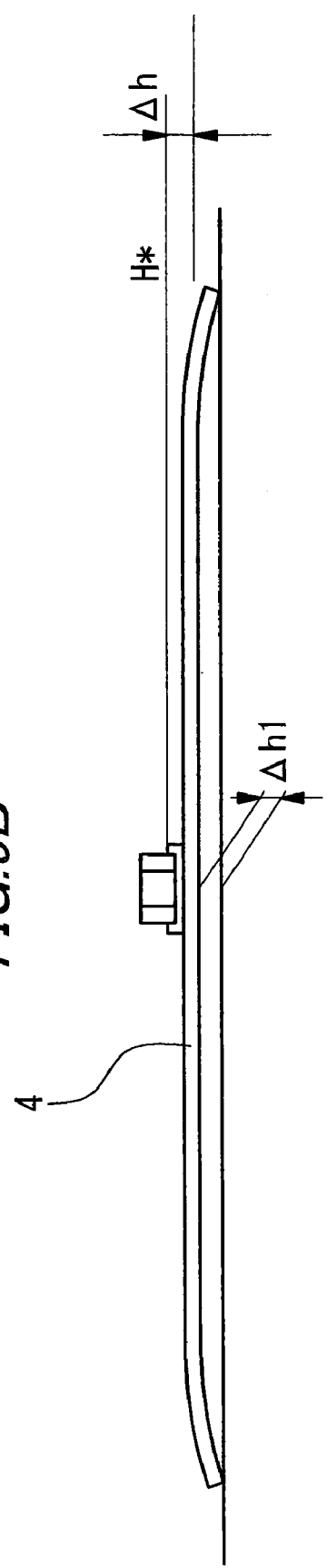

4m: RECOGNITION MARK

6: ELECTRONIC COMPONENT

ELECTRONIC COMPONENT MOUNTING SYSTEM AND ELECTRONIC COMPONENT MOUNTING METHOD

TECHNICAL FIELD

The present invention relates to an electronic component mounting system and an electronic component mounting method for mounting electronic components on a substrate.

BACKGROUND ART

An electronic component mounting system, which uses soldering to mount electronic components on a substrate and to produce a components mounting substrate, is constituted by connecting together a plurality of apparatuses used for mounting electronic components, such as a solder printing apparatus, an electronic component placing apparatus and a reflow soldering apparatus. In order to perform reliable quality control for the electronic component mounting system, an electronic component mounting line equipped with an inspection function is introduced, so that an inspection apparatus is arranged between individual apparatuses (see, for example, patent document 1).

In the example in this patent document 1, a printing inspection apparatus is arranged between the printing apparatus and the electronic component placing apparatus, and this printing inspection apparatus, upon detecting an abnormal state, such as a position shift in the printing location by the printing apparatus, corrects for the position shift by transmitting feedback information to the printing apparatus and, to correct for an adverse affect produced by the abnormal state, also transmits feedforward information to the electronic component placing apparatus at the succeeding stage, and thereafter resumes performance of the placing operation. Through this process, reliable quality control can be provided for the manufacturing process of the components mounting substrate.

[Patent Document 1] JP-A-2002-134899

DISCLOSURE OF INVENTION

Recently, to accompany a constant reduction in the sizes of electronic apparatuses, the sizes of electronic components to be included in the substrate have likewise been reduced, until those used today are tiny. And to mount these tiny components, of necessity, the mounting conditions are such that a loading head must perform a much more delicate placing operation, the designated performance of which must be much more detailed. That is, in order for the tiny components to be mounted stably and positioned highly accurately, not only must horizontal positioning accuracy relative to a substrate be managed, but also great attention must be given to the accuracy of the control provided for a suction nozzle while performing a descending operation, during which an electronic component is held by the suction nozzle and is precisely delivered to a mounting point on the substrate.

However, according to the conventional apparatus disclosed in the above described patent document 1, only horizontal positioning accuracy is regarded as a target for detection and correction, while positioning accuracy relative to height is not so regarded. Therefore, when a variance in the thickness of a substrate is encountered, or when the substrate has been deformed by warping, an electronic component can not be appropriately deposited at a mounting point on the substrate, and this becomes a factor in the occurrence of a mounting defect such as a position shift. As described above, with the conventional mounting system, it is difficult to effectively prevent a mounting defect that is the result of a positioning error in the direction of the thickness of a substrate.

One objective of the present invention is, therefore, to provide an electronic component mounting system and an electronic component mounting method that can prevent a mounting defect due to a positioning error in the direction of the thickness of a substrate, and that can deliver a specific mounting quality.

To achieve this objective, according to this invention, an electronic component mounting system, which is constituted by connecting a plurality of apparatuses, used for mounting electronic components, and which produces a components mounting substrate through the mounting of electronic components on a substrate, comprises: a substrate height measurement apparatus including a first substrate height measuring function for measuring heights at height measurement points designated on an upper face of the substrate, and for outputting the measurement results as substrate height data; an electronic component placing apparatus including a second substrate height measuring function, for employing, as a target, the substrate that is delivered after the substrate height measurement apparatus has performed height measurements, and for at least measuring heights at specific height measurement points, selected from among the height measurement points, and for outputting the measurement results as substrate height correction data, and a component placing function for using a loading head to obtain an electronic component from a component supply unit and to position the electronic component on the substrate; and a parameter update unit, for employing the substrate height data and the substrate height correction data to update a control parameter used to control a component placing operation for the loading head of the electronic component placing apparatus.

Further, according to the invention, an electronic component mounting method, for employing an electronic component mounting system, which is constituted by connecting a plurality of apparatuses used for mounting electronic components, to produce a substrate by mounting electronic components on a substrate, comprises: a first substrate height measurement step of performing a first substrate height measurement function, provided for a substrate height measurement apparatus, to measure heights at measurement points designated on an upper face of the substrate, and to output the measurement results as substrate height data; a second substrate height measurement step of performing, for a substrate that is carried in an electronic component placing apparatus after the first substrate height measurement step, a second substrate height measurement function for at least measuring heights at specific, designated height measurement points selected from among the height measurement points, and outputting the measurement results as substrate height correction data; and a component placing step of using a loading head of the electronic component placing apparatus for securing an electronic component from a component supply unit and for positioning the electronic component on the substrate, whereby, at the component placing step, the substrate height data and the substrate height correction data are employed to update a control parameter that is used to control a component placing operation performed by the loading head of the electronic component placing apparatus.

According to the present invention, a substrate height measurement apparatus measures the heights at height measurement points, designated on the upper face of a substrate, and outputs the measurement results as substrate height data. Then, once the substrate has been delivered to an electronic component placing apparatus, the substrate height measurement apparatus again measures the height of the substrate at specific height measurement points to obtain substrate height correction data, and based on the initial substrate height data and the substrate height correction data, update a control parameter for controlling the component placing operation performed by a loading head. In this manner, discrepancies in the positions of the heights of individual substrates can be accurately corrected, and mounting defects due to positioning errors in the direction of the heights of the substrates can be prevented.

BRIEF DESCRIPTION OF DRAWINGS

FIG. 5 is a block diagram showing the control section of the electronic component mounting system according to the embodiment of the invention.

FIGS. 6A and 6B are cross-sectional views of a substrate for the embodiment, on which components are to be mounted.

BEST MODE FOR CARRYING OUT THE INVENTION

Figure 1:
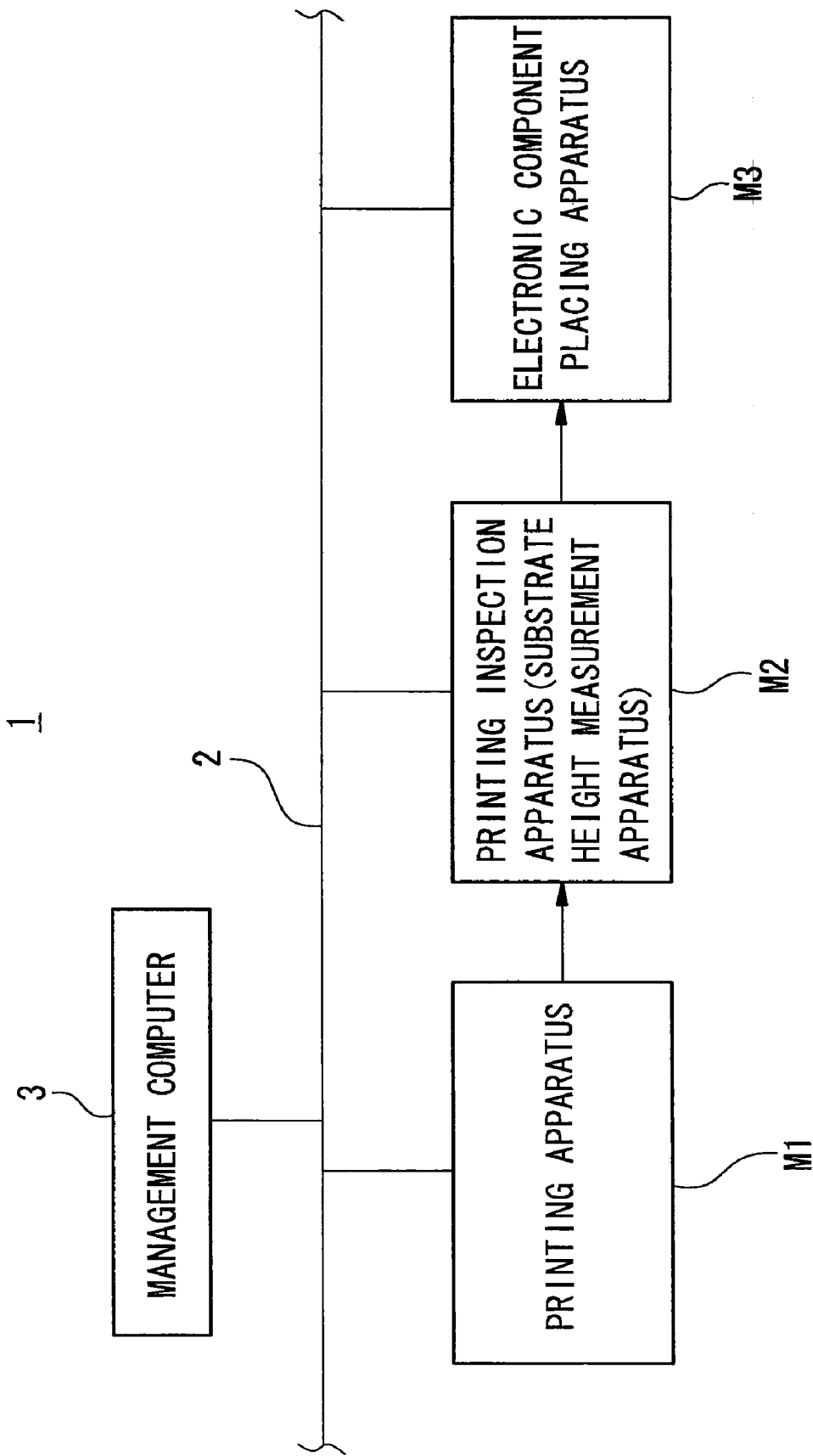
FIG. 1 is a block diagram showing the configuration of an electronic component mounting system according to the embodiment of the invention.

One embodiment of the present invention will now be described. First, the electronic component mounting system will be described while referring to FIG. 1. In FIG. 1, for the electronic mounting system, an electronic component mounting line 1 is formed by connecting together a printing apparatus M1, a printing inspection apparatus M2 and an electronic component placing apparatus M3, all of which apparatuses are used for mounting electronic components, and is connected to a management computer 3, via a communication network 2, so that the computer 3 can control the entire system. By using these electronic component mounting apparatuses, electronic components can be mounted on a substrate, and a components mounting substrate can be produced.

The printing apparatus M1 performs screen printing for the electrodes of a substrate using a solder paste employed to bond electronic components. The printing inspection apparatus M2 inspects the printing condition of the printed solder paste, and also detects the heights at height measurement points that are designated on the upper face of the substrate that has been printed, and outputs the detection results as substrate height data. Thereafter, the electronic component placing apparatus M3 places electronic components onto the substrate on which the solder paste is printed.

Figure 2:
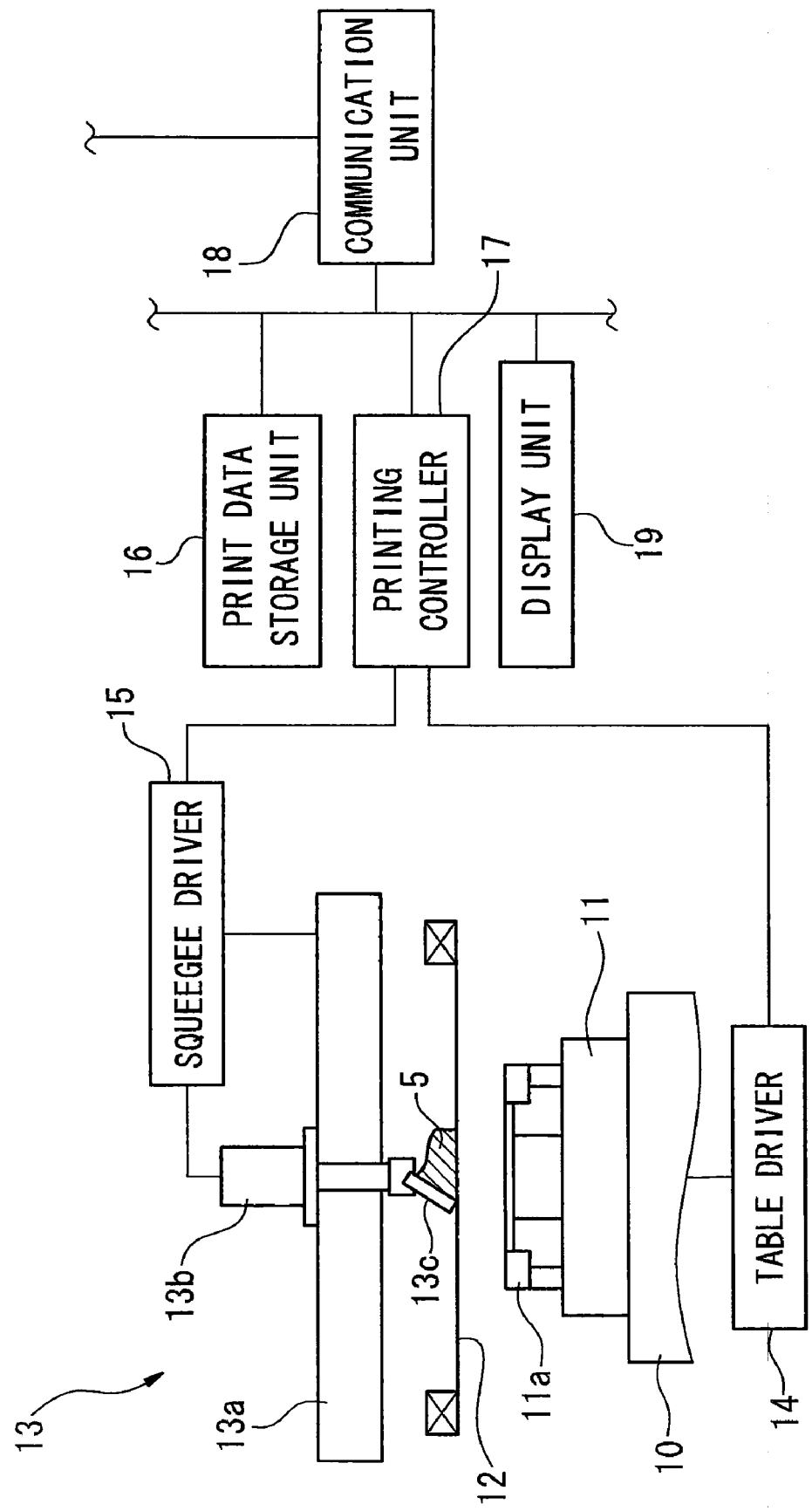
FIG. 2 is a block diagram showing the arrangement of a screen printing apparatus according to the embodiment of the invention.

The arrangements of the individual apparatuses will now be explained. First, the arrangement of the printing apparatus M2 will be described while referring to FIG. 2. In FIG. 2, a substrate holder 11 is arranged on a positioning table 10. The substrate holder 11 uses a clamper 11a to grip and hold two sides of a substrate 4. Located above the substrate holder 11 is a mask plate 12 in which pattern holes (not shown) are formed in consonance with the portions of the substrate 4 that are to be printed. As the positioning table 10 is moved by a table driver 14, the substrate 4 is moved horizontally or vertically relative to the mask plate 12.

A squeegee unit 13 is located above the mask plate 12. The squeegee unit 13 includes: a moving and pressing mechanism 13b, for raising or lowering a squeegee 13c relative to the mask plate 12 and for pressing the squeegee 13c against the mask plate 12 through the application of a predetermined pressing force (printing pressure); and a squeegee moving mechanism 13a, for moving the squeegee 13c horizontally. The moving and pressing mechanism 13b and the squeegee moving mechanism 13a are driven by a squeegee driver 15. When the mask plate 12 is displaced downward until its lower face contacts the substrate 4, and the squeegee 13c is shifted horizontally, at a predetermined speed, along the upper surface of the mask plate 12, to which a coating of a solder paste 5 has been applied, the solder paste 5 is impelled through the pattern holes (not shown) in the mask plate 12 and print the upper face of the substrate 4.

This printing operation, performed by the table driver 14 and the squeegee driver 15, is controlled by a printing controller 17. And during this printing process, the operation of the squeegee 13c and the positioning of the substrate 4 and the mask plate 12 are controlled based on print data stored in a print data storage unit 16. Meanwhile, a display unit 19 displays various index data, detailing the operating state of the printing apparatus, and warnings indicating abnormalities encountered in the printing state, while a communication unit 18 exchanges data, via the communication network 2, with the management computer 3 or the other apparatuses constituting the electronic component mounting line 1.

Figure 3:
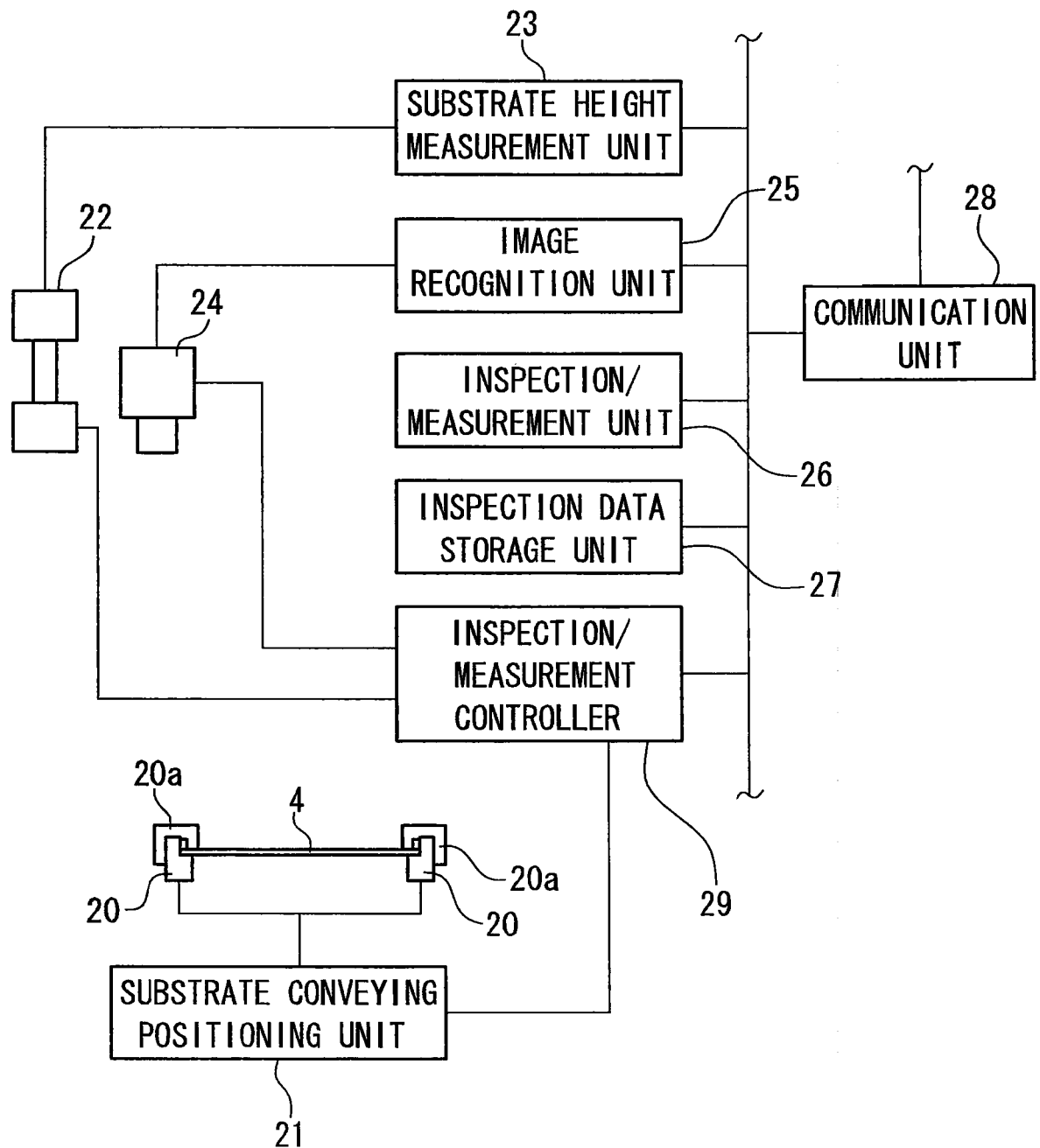
FIG. 3 is a block diagram showing the arrangement of a printing inspection apparatus according to the embodiment of the invention.

Next, while referring to FIG. 3, an explanation will be given for the printing inspection apparatus M2. In FIG. 3, the substrate 4 is held along conveying rails 20, clamped at its two ends by clamping members 20a. When a substrate conveying and positioning unit 21 is driven, the substrate 4 is conveyed along the conveying rails 20 and positioned at a location whereat it can be inspected or measured, as is described below.

A height measurement device 22 and a camera 24 are arranged above the substrate 4 held along the conveying rails 20. The height measurement device 22 includes a function for precisely measuring the distance to a measurement target, and is used to measure the distances to height measurement points designated for the substrate 4. The obtained measurement data are then processed by a substrate height measurement unit 23, to obtain the heights at the height measurement points on the substrate 4. Further, the imaging results obtained by the camera 24 are processed by an image recognition unit 25, which permits the printed state of the solder paste to be inspected. The height measurement unit 22 and the camera 24 can be displaced across the horizontal plane by moving means, and an arbitrary position on the substrate 4 can be selected as a height measurement or inspection target.

The height data obtained by employing the height measurement and printed state inspection results are processed by an inspection/measurement processor 26, and the resultant data are output as substrate height data and printed state inspection results.

These output data are transferred, via a communication unit 28 and the communication network 2, to the management computer 3 and to the other apparatuses. The inspection/measurement processor 26 controls the substrate conveying and positioning unit 21, the height measurement device 22 and the camera 24 during the performance of the inspection/measurement operation. Therefore, the printing inspection apparatus M2 serves as a substrate height measurement apparatus that includes a first substrate height detection function for measuring the heights at the designated height measurement points on the upper face of the substrate 4 and for outputting the detection results as substrate height data.

Figure 4:
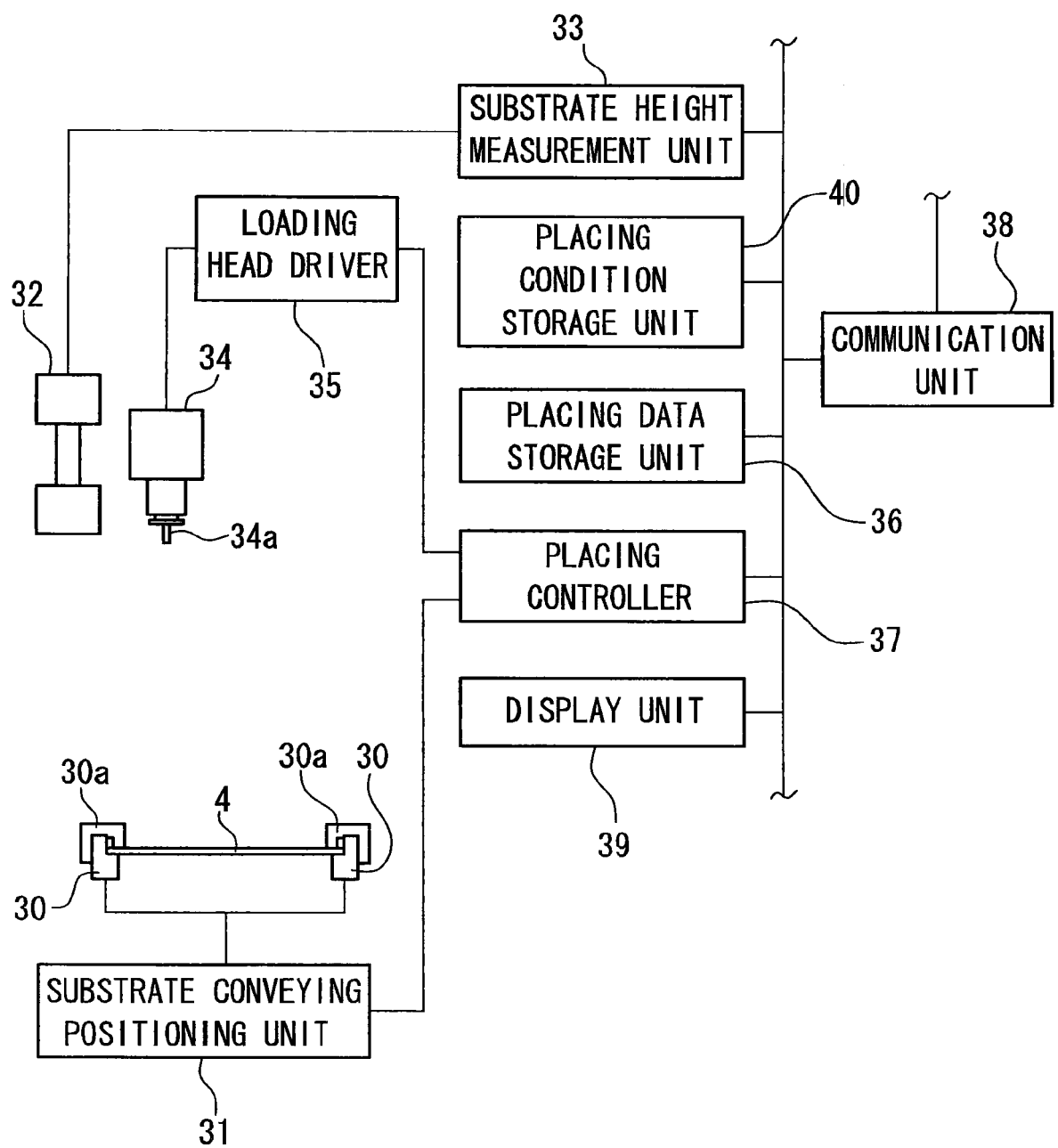
FIG. 4 is a block diagram showing the arrangement of an electronic component placing apparatus according to the embodiment of the invention.

Sequentially, the arrangement of the electronic component placing apparatus will be explained while referring to FIG. 4. In FIG. 4, the substrate 4 is held by conveying rails 30 with its two ends clamped by clamping members 30a. The clamping members 30a of the conveying rails 30 that grip the substrate 4 have the same structure as the clamping members 20a of the conveying rails 20 for the printing inspection apparatus M2, so as to hold the substrate 4, as much as possible, in the same state as during the printing inspection process. When a substrate conveying and positioning unit 31 is driven, the substrate 4 is conveyed along the conveying rails 30 and positioned at a component placing location for a loading head 34 that will be described below.

A height measurement device 32, which is to be moved by moving means (not shown), and the loading head 34, which is to be moved by a head moving mechanism (also not shown), are arranged above the substrate 4 held by the conveying rails 30. The height measurement device 32 has the same measurement function as the height measurement device 22. In this embodiment, among the height measurement points that were previously designated for the substrate 4 and were measured as targets by the printing inspection apparatus M2, the height measurement device 32 employs, as height measurement targets, specific height measurement points that were designated in advance for the acquisition of substrate height correction data.

A substrate height measurement unit 33 processes measurement data for the height measurement points obtained by the height measurement device 32, and obtains substrate height correction data that represent the heights of the specific height measurement points described above. The height measurement device 32 and the substrate height measurement unit 33 together constitute a second substrate height measurement function means. When a component placing operation that will be described later is performed, the obtained substrate height correction data are employed to correct the substrate height data obtained by the printing inspection apparatus M2.

The loading head 34 includes a nozzle 34a to which an electronic component can be held by suction. Using suction, applied through the nozzle 34a, the loading head 34 extracts an electronic component from a component supply unit (not shown). The loading head 34 is then moved to above the substrate 4 and lowered toward it, so that the electronic component held by the nozzle 34a is placed on the substrate 4. During this placing operation, based on placing data stored in a placing data storage unit 36, i.e., based on coordinates for the mounting of an electronic component on the substrate 4, a placing controller 37 controls the substrate conveying and positioning unit 31 and a loading head driver 35, so that the position at which an electronic component is placed on the substrate 4 can be adjusted using the loading head 34.

At this time, as the loading head 34 is controlled while taking into account placing condition data stored in a placing condition storage unit 40, i.e., by applying control parameters for a detailed placing operation pattern used when moving the nozzle 34a of the loading head 34, a precise placing operation can be performed, as will later be described.

A display unit 39 displays index data representing various operating states for the electronic component placing apparatus M3, and warnings indicating abnormalities in the placing state. A communication unit 38 exchanges data, via the communication network 2, with the management computer 3 or the other apparatuses that constitute the electronic component mounting line 1.

That is, the electronic component placing apparatus M3 includes: a second substrate height measurement function, for measuring heights, at least at specified height measurement points, for the substrate 4, which is delivered after the printing inspection apparatus M2 (substrate height measurement apparatus) has performed the height measurements, and for outputting the measurements as substrate height correction data; and a component placing function, for using the placing head to secure an electronic component from a component supply unit and for positioning the electronic component on the substrate 4.

The arrangement of the control section of the electronic component mounting system will now be described while referring to FIG. 5. Here, a data exchange function will be explained that is used to perform the updating of a control parameter used for an electronic component mounting process. In FIG. 5, an overall controller 50 handles the transmission and reception of data for the control process that is performed by the management computer 3. The overall controller 50 receives data, via the communication network 2, transferred by the individual apparatuses constituting the electronic mounting line 1, and based on a predesignated processing algorithm, outputs parameter update data, via the communication network 2, to the individual apparatuses.

Specifically, the inspection/measurement unit 26, prepared for the printing inspection apparatus M2 in FIG. 3, is connected to the communication network 2 via the communication unit 28, and the individual units provided for the printing apparatus M1 and the electronic component placing apparatus M3 (see FIGS. 2 and 4) are respectively connected to the communication network 2 via the communication units 18 and 38. With this arrangement, based on data extracted during the inspection and measurement process performed by the printing inspection apparatus M2, the feedback process, for correcting or updating a control parameter used by the upstream apparatus, or the feedforward process, for correcting or updating a control process used by the downstream apparatus, can be performed at any time during the operation of the individual apparatuses. It should be noted that instead of the management computer 3 being provided, the data exchange function may be prepared for the controllers of the individual apparatuses.

While referring to FIGS. 6 and 7, an explanation will be given for warp deformation of the substrate 4 on which electronic components are to be mounted, and the substrate height measurement process performed by the printing inspection apparatus M2 and the electronic component placing apparatus M3 in order to detect this warp deformation state. In FIG. 6A, the substrate 4 in the normal state before it is deformed is shown. When an electronic component 6 is to be mounted on the substrate 4, a mounting height H is designated by employing, as a reference, the upper face of the solder paste 5 printed on the substrate 4. During the placing operation using the loading head 34, the movement of the loading head 34 is controlled by employing the mounting height H as a reference.

The actual deformed state of the substrate 4 is shown in FIG. 6B. When a thin substrate having a low rigidity, such as a resin substrate, is employed as the substrate 4, the substrate 4 tends to be warped, upward, providing a convex form as shown in FIG. 6B, and at a mounting location inside the substrate 4, a displacement Δh1 occurs vertically, relative to the normal state. When the loading head 34 is moved for the substrate 4 in this state, in the same manner as for the substrate 4 in the normal state in FIG. 6A, the placing operation may not be correctly performed. Therefore, according to the electronic component mounting method of this mode, and before the electronic component is mounted, the printing inspection apparatus M2 performs a substrate height measurement, detects in advance a displacement Δh1 caused by the warping deformation of the substrate 4, described above, and obtains a corrected mounting height H* calculated in accordance with the displacement Δh1.

Figure 7A:
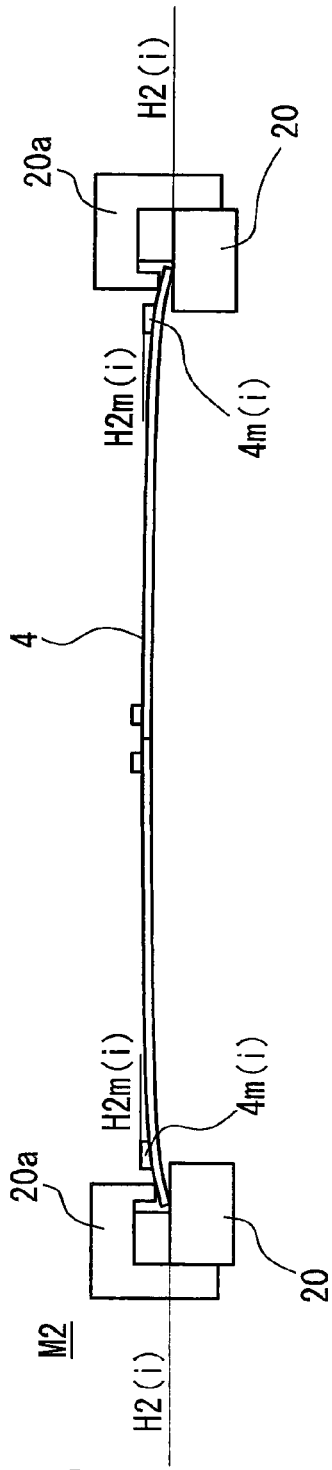
FIGS. 7A to 7C are diagrams for explaining the substrate height measurement processing performed by the electronic component mounting system of this embodiment.
Figure 7B:
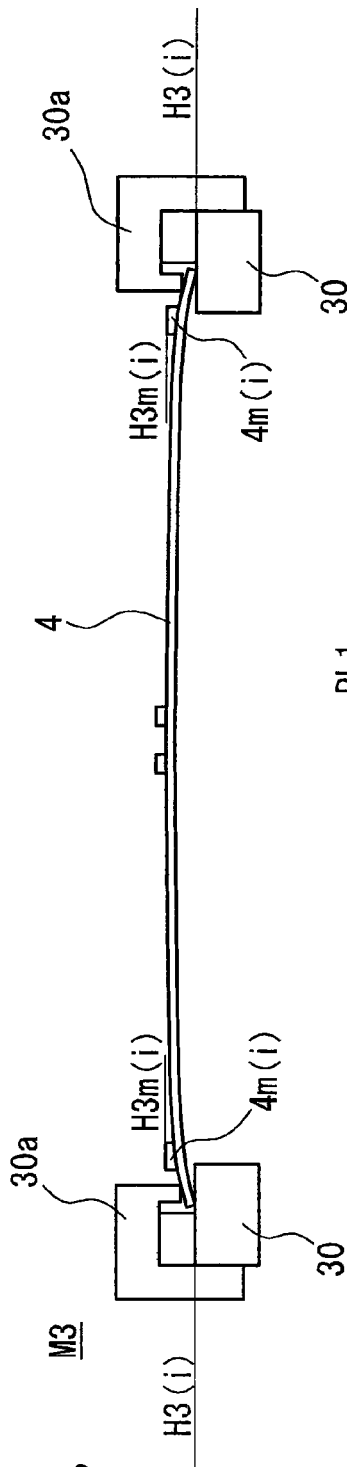
Figure 7C:
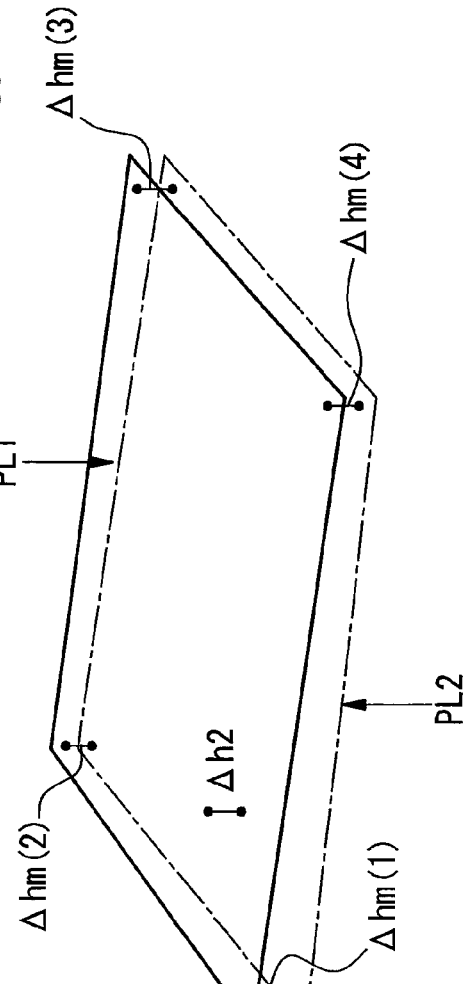

Further, according to the electronic component mounting method of this mode, not only is an error that is due to the warping deformation of the substrate 4 in the direction of the height employed as a correction target, but also an error that is due to a height difference between the apparatuses in FIGS. 7A to 7C. In FIG. 7A, H2($i$) denotes the height of a plurality of points on the conveying planes of the conveying rails 20 of the printing inspection apparatus M2. Likewise, in FIG. 7B, H3($i$) denotes the height of a plurality of points on the conveying planes of the conveying rails 30 of the electronic component placing apparatus M3. It should be noted that (i) is an indicator representing each point.

According to design data, H2($i$) and H3($i$) are individual points on the same conveying path line, and are assumed to have the same height. However, since there is a difference, more or less, in the heights, along the conveying line, of the conveyers used for individual apparatuses, because the line is formed by coupling together a plurality of apparatuses, the heights H2($i$) and H3($i$) may vary.

Thus, because of the above described variance, the height of the upper face of a substrate 4 will differ between the state wherein the substrate 4 is held in position by the conveying rails 20 of the printing inspection apparatus M2 and a state wherein it is held in position by the conveying rails 30 of the electronic component placing apparatus M3.

When the clamped state of a substrate 4 varies between when its ends are gripped by the clamping members 20a for the conveying rails 20 and when they are gripped by the clamping members 30a for the conveying rails 30, and when, in addition, a foreign substance, such as dust, is caught between the conveying faces or the clamped faces, repeatability for the height reading for the upper face of the substrate 4 becomes low.

The state wherein a substrate 4 is held by the conveying rails 20 must be well reproduced when the substrate 4 is held by the conveying rails 30, so that height measurement information for the substrate 4, which the printing inspection apparatus M2 obtained through measurements made at the height measurement points on the substrate 4, acts on the component placing operation performed by the electronic component placing apparatus M3. However, as described above, actually, repeatability can not be expected when the substrate 4 is held and positioned by conveying rails that differ for each apparatus, and some means must be employed to correct the height differences between the apparatuses.

Therefore, according to the electronic component mounting method of this mode, recognition marks 4m, at four corner locations on a substrate 4, are defined as height reference points (specific height measurement points), and height differences between the apparatuses are corrected based on results obtained when the printing inspection apparatus M2 and the electronic component placing apparatus M3 have measured the heights of the same recognition marks 4m. That is, the heights of the recognition marks 4m on a substrate 4 held by the conveying rails 20 are measured, and H2m(i) is obtained for the individual recognition marks 4m(i). Likewise, the heights of the recognition marks 4m on the substrate 4 when held by the conveying rails 30 are measured, and H3m(i) is obtained for the individual recognition marks 4m(i). And for the same recognition marks 4m(i), a height change Δh1m(i) (=H2m(i)−H3m(i)) (i=1 to 4) is obtained as substrate height correction data. Incidentally, instead of the recognition marks 4m, other featured locations may be employed as height reference points.

Then, as shown in FIG. 7C, by using the obtained data, Δhm(i) (i=1 to 4), a three-dimensional coordinate transformation is obtained to correlate a point on a plane PL1, which is defined by the recognition marks 4m on the substrate 4 that is held by the conveying rails 20, with a point on a plane PL2, which is defined by the recognition marks 4m on the substrate 4 that is held by the conveying rails 30. As a result, a height difference Δh2 between the planes PL1 and PL2 can be calculated for an arbitrary point on the substrate 4. Therefore, a correction of the mounting height can be performed by considering not only the displacement Δh1, the result of the warping deformation of the substrate 4 shown in FIG. 6, but also the height displacement Δh2, between the apparatuses, caused by differences in the heights.

Figure 8A:
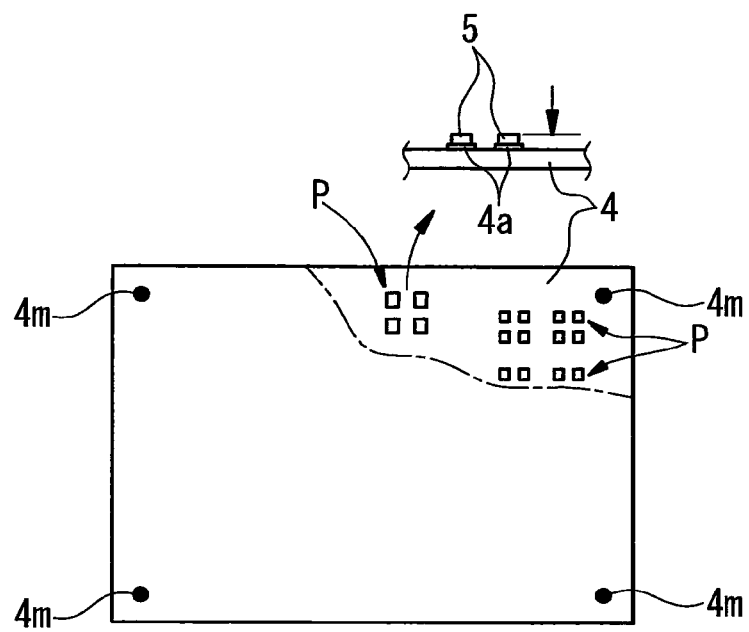
FIGS. 8A to 8C are plan views of the substrate of this embodiment, on which components are to be mounted.
Figure 8B:
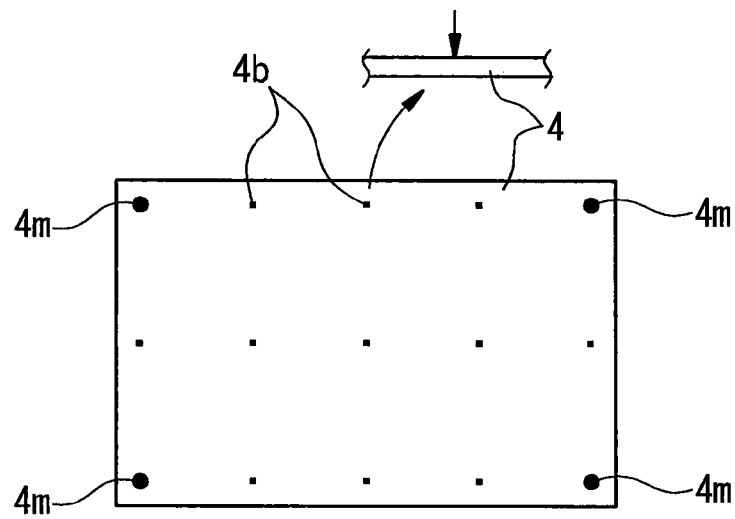
Figure 8C:
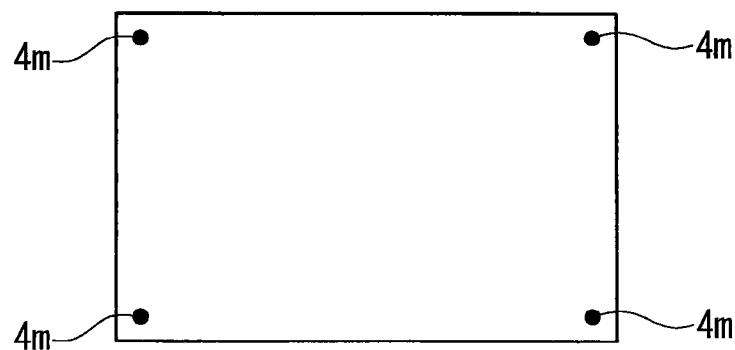

As a mode for setting the height measurement point to perform such a mounting height correction, two methods shown in FIG. 8 can be selected, depending on the deformed state of the substrate 4 and the type of electronic component 6. That is, when the deformation of the substrate 4 does not indicate a specific trend, and the deformed state is irregular, or when extremely accurate mounting height control is required for the electronic components that are to be mounted, the printing inspection apparatus M2 employs, as height measurement points, the printing component mounting positions P, as shown in FIG. 8A, provided after the printing of a solder has been performed, in addition to the recognition marks 4m provided at the four corner locations. And the printing inspection apparatus M2 directly measures the height of the upper face of the solder paste 5 that has been printed on the electrodes 4a. Thereafter, the electronic component placing apparatus M3 measures, as targets, the heights only of the recognition marks 4m shown in FIG. 8C, calculates the above described height change value Δh2, based on the height measurement results, and obtains the corrected mounting height H* by adding these results to the measurement results obtained by the printing inspection apparatus M2.

FIG. 8B is a diagram showing an example wherein the printing inspection apparatus M2 performs height measurement not only for the recognition marks 4m provided at the four corner locations, but also height measurement points 4b set up in advance on the substrate 4, regardless of the mounting positions. In this example, premised is an appropriate arrangement, such as a matrix arrangement, for multiple measurement points designated to obtain, overall, a description of the deformed shape of a substrate 4, and the printing inspection apparatus M2 performs height measurements for these multiple measurement points and, based on the results obtained, infers a three-dimensional surface shape for the substrate 4. Specifically, an approximate value for the vertical displacement Δh1, at an arbitrary position on the substrate 4, is calculated through numerical computation. The electronic component mounting apparatus M3 measures the heights only of the recognition marks 4m in FIG. 8C, as targets, calculates the height change Δh2 based on the height measurement results, and obtains the corrected mounting height H* by adding the height change Δh2 to the measurement results obtained by the printing inspection apparatus M2.

In this embodiment, the substrate height data and the substrate height correction data are employed not only to obtain the corrected mounting height H*, but also to update or correct control parameters used for the component placing operation, i.e., a velocity parameter, a position parameter and a placement parameter, as will be described later. These control parameters are conventionally set as fixed values, in advance, in accordance with the component types. In this embodiment, however, for the control parameters, data tables in which are entered different values for the individual component types are stored in the placing condition storage unit 40, in accordance with the substrate height data and the substrate height correction data.

Each time the printing inspection apparatus M2 performs a substrate height measurement for an individual substrate, the electronic component placing apparatus M3 receives the measurement results as substrate height data. Further, the second substrate height measurement function, prepared for the electronic component placing apparatus M3, obtains substrate height correction data that it adds to the previously obtained substrate height data to produce substrate height calculation results. The placing controller 37 replaces parameter values, which are consonant with the calculation results, with predesignated values that are read from the data table. In this manner, the control parameters can be finely adjusted.

Therefore, the placing controller 37 serves as parameter updating means and employs the substrate height data and the substrate height correction data to update control parameters that are used to control the component placing movement of the loading head 34 of the electronic component placing apparatus M3. As described above, substrate height computation results are obtained by correcting the substrate height data using the substrate height correction data, and the control parameters are updated in accordance with the substrate height computation results. Therefore, electronic components can be mounted while more accurate control is provided for the movement of the lading head 34, without component positioning shifts being required or mounting errors occurring. Furthermore, an appropriate soldering condition is ensured during the succeeding reflow soldering process, and precise, reliable and superior component mounting can be performed.

Figure 9A:
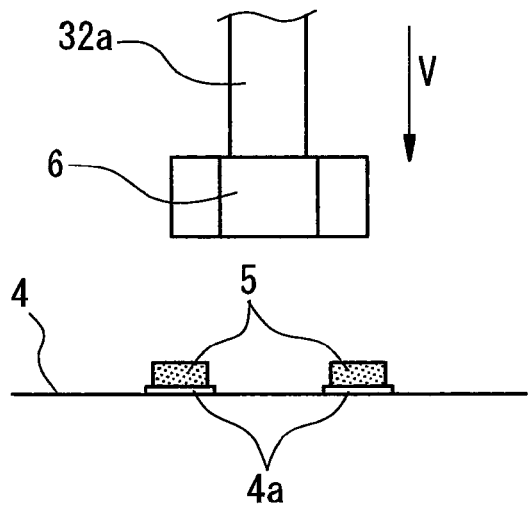
FIGS. 9A to 9C are diagrams for explaining a control parameter used for an electronic component placing operation according to this embodiment.
Figure 9B:
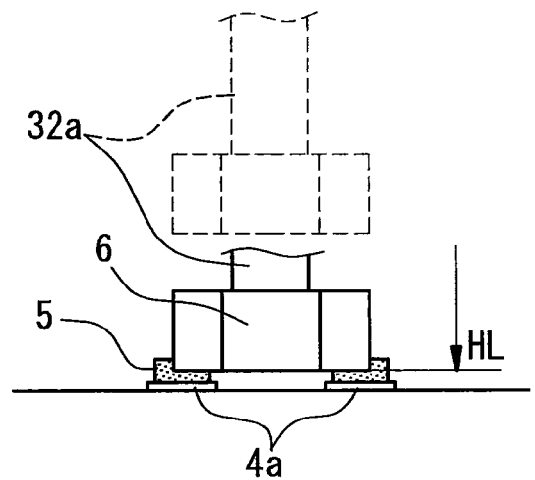
Figure 9C:
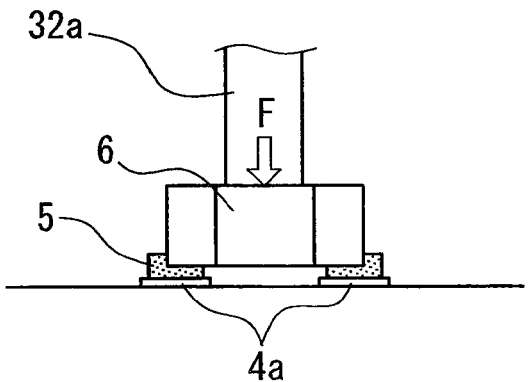

The velocity parameter is a control parameter that, as shown in FIG. 9A, defines a velocity pattern for a head elevating/lowering velocity V for elevating or lowering the loading head 34 relative to the substrate 4. The position parameter is a control parameter that, as shown in FIG. 9B, defines a lower limit position HL for an electronic component 6 when the loading head 34, which holds the electronic component 6 that uses the nozzle 34a, is lowered. The placement parameter is a control parameter that, as shown in FIG. 9C, defines a pressure force F, the force with which the electronic component 6 is pressed against the substrate 4 by the loading head 34.

The control parameters are not limited to these items, and other items may be linked with the substrate height measurement results. For example, after the electronic component 6 has been deposited on the substrate 4, and before the nozzle 34a is to be separated from the upper face of the electronic component 6 attached to the solder paste 5, air is exhausted through the nozzle 34a, i.e., air, under a positive pressure, is exhausted through the nozzle 34a. This air pressure and the air exhaustion timing may be employed as variable control parameters, and these control parameters may be changed in accordance with the substrate height measurement results.

Figure 10:
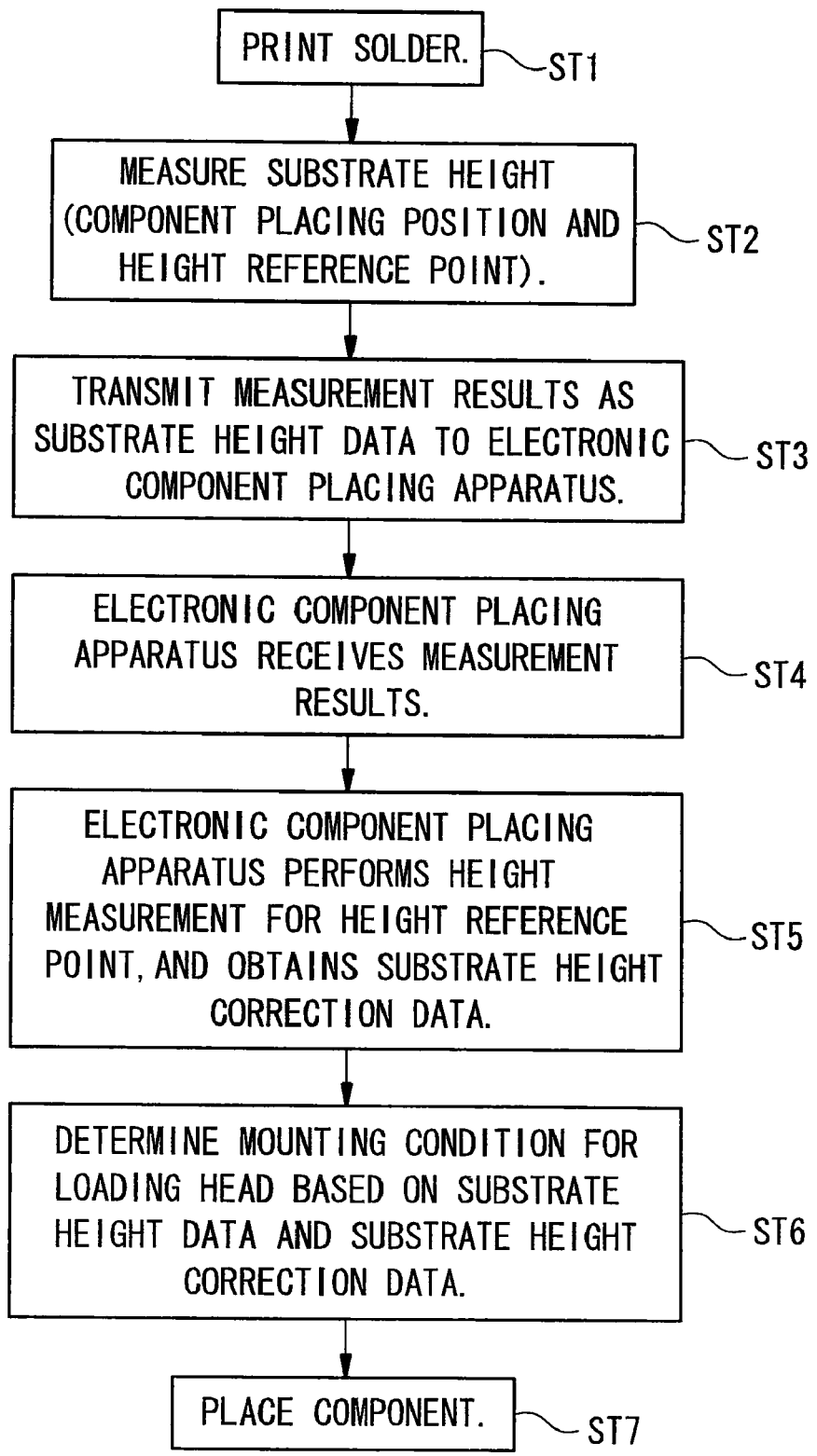
FIG. 10 is a flowchart for the operation of the electronic component mounting system according to the embodiment.
Figure 11A:
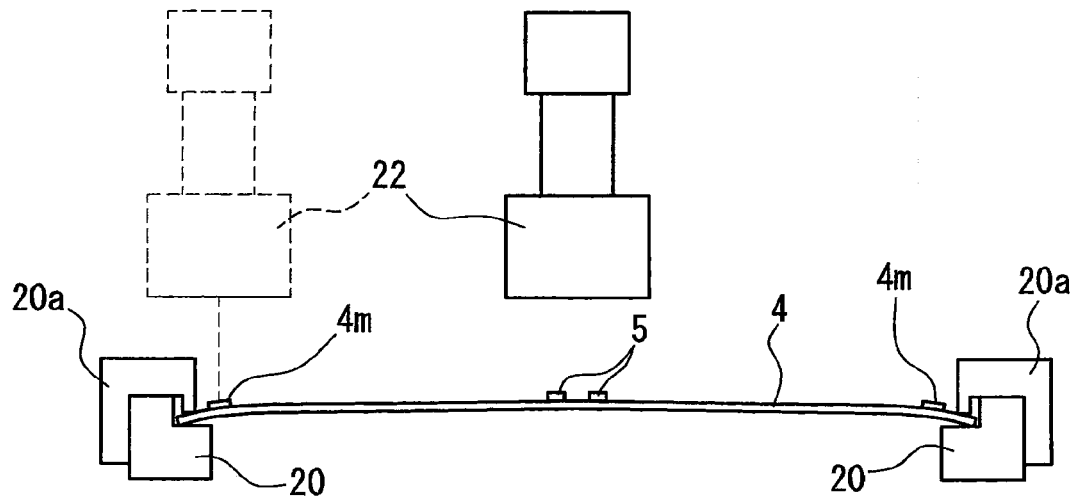
FIGS. 11A to 11C are diagrams for explaining the processing performed by the electronic component mounting system of this embodiment.
Figure 11B:
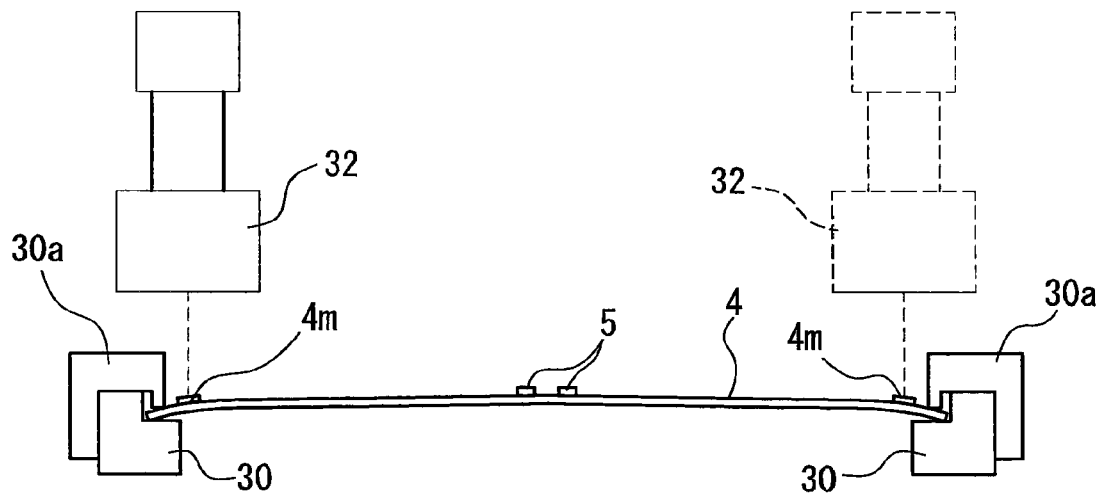
Figure 11C:
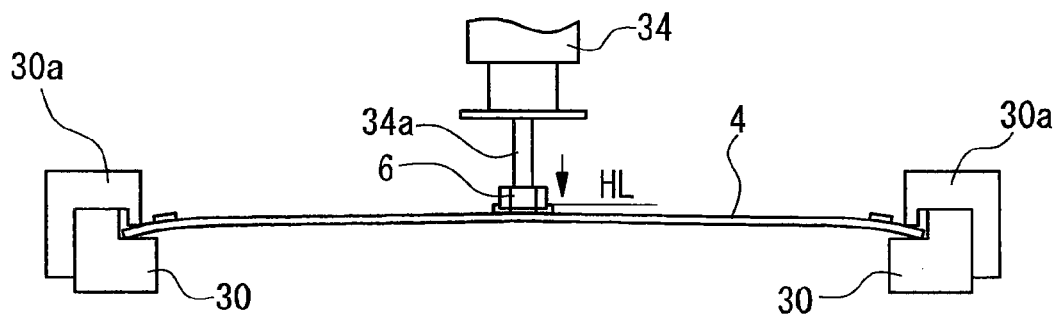

The electronic component mounting processing performed by the electronic component mounting system will now be explained while referring to FIGS. 10 and 11. During the electronic component mounting operation, as shown in FIG. 10, first, the printing apparatus M1 prints the solder paste 5 on the substrate 4 (ST1). Then, the substrate 4 is conveyed to the printing inspection apparatus M2, which inspects the solder printing state, and as shown in FIG. 11A, performs the substrate height measurements, while the height measurement device 22 is located at the component mounting position, a height measurement point for the substrate 4, and is also located above the recognition mark 4m, which is the height reference point (ST2).

Through this measurement process, the corrected mounting height H (see FIG. 6B), which indicates the height of the upper face of the solder paste 5 printed on the target mounting position, is obtained directly and is output as substrate height data. Sequentially, the substrate 3 is conveyed to the electronic component placing apparatus M3, while at the same time, the measurement results are transmitted to the electronic component placing apparatus M3 (ST3), via the communication network 2, as substrate height data.

Following this, the electronic component placing apparatus M3 receives the measurement results (ST4), and measures the heights at the reference points to obtain substrate height correction data (ST5).

Then, the electronic component placing apparatus M3 determines the mounting condition, for the loading head 34, based on the received substrate height data and the substrate height correction data that have been calculated based on measurement results obtained by the apparatus M3 (ST6). That is, for the individual mounting positions, the control parameters are updated based on the substrate height data and the substrate height correction data. In this embodiment, each time a target substrate 4 is conveyed to the electronic component placing apparatus M3, the substrate height data measured for the substrate 4 are transmitted to the electronic component placing apparatus M3, so that the updating of the control parameters can be performed in real time during the sequential production process.

Thereafter, the electronic component placing apparatus M3 moves the loading head 34, using the updated control parameters, to place the electronic component 6 onto the substrate 4 (ST7). That is, as shown in FIG. 11A, the loading head 34, which uses the nozzle 34a to hold the electronic component 6, is lowered in accordance with an appropriate velocity pattern until the lower face of the electronic component 6 reaches the lower limit position HL, which corresponds to the corrected mounting height H*. Then, through the application of a proper pressure, the electronic component 6 is pressed down.

As a result, the electronic component 6 is accurately placed, at the correct position, without a placing position shift occurring that is due to an inappropriately designated lowering velocity. Further, the electronic component 6 is settled down, from the upper face of the solder paste 5, to a depth equivalent to that for an electronic component 6 that has been properly pressed down. Therefore, the bonding terminals of the electronic component 6 are aligned with the electrodes 4a of the substrate 4 through the solder paste 5, which has an appropriate thickness. Since in this state the substrate 4 is conveyed to and is heated by the reflow soldering apparatus, the terminals of the electronic component 6 can be bonded to the electrodes 4a under appropriate soldering conditions.

Specifically, the electronic mounting method comprises:

the first substrate height measurement step of employing the first substrate height measurement function of the printing inspection apparatus M2 to measure the heights of the height measurement points that are set for the upper face of the substrate 4, and to output the measurement results as substrate height data;

the step of the second substrate height measurement function measuring the heights of the height reference points, which are specific height measurement points for a substrate 4 that is conveyed to the electronic component placing apparatus M3 following the first substrate height measurement step, and outputting the measurement results as substrate height correction data; and a placing step of employing the loading head 34 of the electronic component placing apparatus M3 to pick up an electronic component 6 from a component supply unit, and of placing the electronic component 6 on the substrate 4. When the placing process is initiated, the substrate height data and the substrate height correction data are employed to update control parameters that are used to control the component placing movement of the loading head 34 of the electronic component placing apparatus M3.

Further, at the least, the velocity parameter that defines the velocity pattern for the head elevation/lowering speed, for elevating or lowering the loading head 34 relative to the substrate 4, the position parameter that defines the lower limit position when the loading head 34 is lowered, or the placement parameter that defines a pressing force, applied when an electronic component 6 is to be pressed down against a substrate 4 by the loading head 34, is employed as the control parameter.

As described above, for the component placing process, the substrate height data are employed to update the control parameters used to control the component placing movement of the loading head 34. Therefore, when a substrate, such as a thin resin substrate, that is easily bent and warped is employed, discrepancies in the heights of individual substrates can be corrected, and a mounting defect caused by a positioning error in the direction of the height of the substrate can be prevented. Further, while a bearing pin for warp correction is conventionally required when a substrate that is easily warped is employed, for this invention, such a pin is not required, and the substrate bearing mechanism can be simplified.

This application is based upon and claims the benefit of priority of Japanese Patent Application No. 2005-369653 filed on Dec. 22, 2005, the contents of which are incorporated herein by reference in its entirety.

INDUSTRIAL APPLICABILITY

According to the electronic component mounting system and the electronic component mounting method of the invention, differences in the heights on the individual substrates can be corrected for, and a mounting defect caused by a positioning error in the direction of the height of a substrate can be prevented. The present invention can be applied for the field for the mounting of electronic components in a substrate using soldering and thereby producing a components mounting substrate.

The invention claimed is:

1. An electronic component mounting method, for employing an electronic component mounting system, which is constituted by coupling a plurality of apparatuses used for mounting electronic components, to produce a substrate by mounting electronic components on the substrate, comprising:

a first substrate height measurement step of performing a first substrate height measurement function, provided by a substrate height measurement apparatus, of measuring heights at height measurement points designated on an upper face of the substrate, and outputting the measurement results as substrate height data;

a second substrate height measurement step of performing, for the substrate that is carried to an electronic component placing apparatus after the first substrate height measurement step, a second substrate height measurement function, provided by the electronic component placing apparatus, of at least measuring heights at designated specific height measurement points selected from among the height measurement points, and outputting the measurement results as substrate height correction data; and a component placing step of using a loading head of the electronic component placing apparatus of securing an electronic component from a component supply unit and of positioning the electronic component on the substrate, whereby, at the component placing step, the substrate height data and the substrate height correction data are employed to update a control parameter that is used to control a component placing operation performed by the loading head of the electronic component placing apparatus.

2. An electronic component mounting method according to claim 1, whereby the control parameter at least includes one of a velocity parameter, for defining a velocity pattern for a head movement velocity at which the loading head is elevated or lowered relative to the substrate, a position parameter, for defining a lower limit position to which the loading head is to be lowered, and a placement parameter, for defining a force, a pressure applied when an electronic component is pressed against the substrate by the loading head.

3. An electronic component mounting method according to claim 1, whereby the height measurement points obtained by the first substrate height measuring function are locations of recognition marks, provided at four corner locations of the substrate, and component mounting locations; and wherein the specific height measurement points, obtained by the second substrate height measuring functions, are locations of recognition marks provided at the four corners of the substrate.

4. An electronic component mounting method according to claim 1, whereby the heights at the height measurement points obtained by the first substrate height measuring function are locations of recognition marks provided for the four corner locations on the substrate and a plurality of measurement points arranged as in a matrix; and wherein the specific height measurement points obtained by the second substrate height measuring functions are locations of recognition marks provided at the four corners of the substrate.

5. An electronic component mounting method according to claim 1, wherein the height measurement points are located on the substrate in a discontinuous manner.

* * * * *